(12) United States Patent
Nasum et al.

(10) Patent No.: US 10,840,013 B2
(45) Date of Patent: Nov. 17, 2020

(54) GALVANIC ISOLATION IN DEVICES

(71) Applicant: Texas Instruments Incorporated, Dallas, TX (US)

(72) Inventors: Sreeram Subramanyam Nasum, Bangalore (IN); Tarunvir Singh, Jalandhar (IN); Suvadip Banerjee, Horamavu (IN); Kumar Anurag Shrivastava, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/986,557

(22) Filed: May 22, 2018

(65) Prior Publication Data
US 2019/0362890 A1    Nov. 28, 2019

(51) Int. Cl.
*H01F 38/14* (2006.01)
*H03B 5/12* (2006.01)

(52) U.S. Cl.
CPC ........... *H01F 38/14* (2013.01); *H03B 5/1203* (2013.01)

(58) Field of Classification Search
CPC ................................ H01F 38/14; H02J 5/005
USPC ....................................... 331/117 R; 307/104
See application file for complete search history.

(56) References Cited

U.S. PATENT DOCUMENTS

| 5,952,849 | A | 9/1999 | Haigh |
| 2005/0057277 | A1 | 3/2005 | Chen et al. |
| 2014/0369433 | A1* | 12/2014 | Feldtkeller ............... H03K 5/06 |
| | | | 375/258 |
| 2016/0126754 | A1* | 5/2016 | Ichikawa ................ H02J 7/025 |
| | | | 307/104 |

FOREIGN PATENT DOCUMENTS

| RU | 109621 | 10/2011 |
| SU | 27113 | 5/2005 |

OTHER PUBLICATIONS

International Search Report in corresponding PCT Patent Application No. PCT/US2019/033497, dated Sep. 5, 2019 (2 pages).

* cited by examiner

*Primary Examiner* — Joseph Chang
(74) *Attorney, Agent, or Firm* — Ray A. King; Charles A. Brill; Frank D. Cimino

(57) ABSTRACT

A device includes a transformer that further includes a primary and a secondary windings. A switch is coupled to the primary winding, and this switch is controlled by the received digital input signal. An oscillator is further formed on the secondary winding where the oscillator oscillates in response to variations of the received input signal. A detector coupled to the oscillator will then detect the oscillations in response to the variations of the received input signal. Thereafter, the detector generates a digital output based on the detected oscillations.

19 Claims, 4 Drawing Sheets

GALVANIC ISOLATION IN DEVICES

BACKGROUND

Galvanic isolation in power equipment, devices, or components in devices, refers to electrical and physical isolation of an output side from an input side. The physical isolation includes output power wirings that are not directly coupled or connected to input wirings. Electrical isolation includes transmission of energy through optical, acoustic, electromagnetic waves, and the like.

Devices, such as personal computers, and hand-held devices have built-in galvanic isolation. In many instances, galvanic isolation is mandated by international safety agencies to prevent shock hazards.

SUMMARY

Described herein is a technology for a signal isolation in a device. For example, the device implements a digital to analog converter (DAC) where a galvanic isolator couples microcontroller digital signals to the DAC. In this example, the galvanic isolator includes a transformer-primary winding that receives the digital signals from the microcontroller. The galvanic isolator further includes an inductance-capacitance (LC) oscillator formed on a transformer-secondary winding. This LC oscillator oscillates in response to variations of the received input signals. Thereafter, a detector that is coupled to the oscillator generates a digital output based on detected oscillations of the oscillator.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

In an embodiment, a device includes a transformer with primary and secondary windings. The primary winding receives an input signal through a switch that is coupled to the primary winding. An oscillator, which is formed on the secondary winding, will oscillate in response to variations of the received input signal. A detector, which is coupled to the oscillator, will then detect oscillations that react to variations of the received input signal. Thereafter, the detector generates a digital output based on the detected oscillations.

Figure 1:
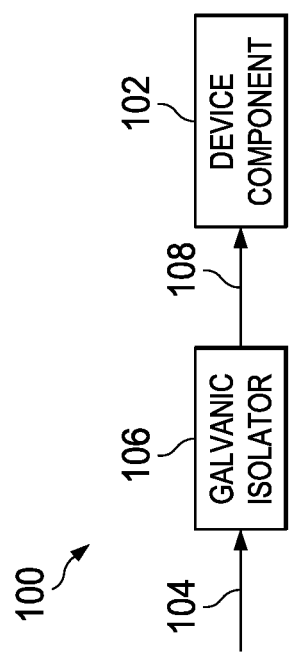
FIG. 1 is an example of a device that implements a signal isolation as described herein.

FIG. 1 is an example device 100 that implements galvanic isolation or signal isolation as described herein. The device 100, for example, is a multi-chip module (MCM) that includes a digital-to-analog converter (DAC) component 102. The device 100 utilizes galvanic isolation to provide data transfer.

The MCM device 100 includes a digital signal 104 that is received by a galvanic isolator 106. The digital signal 104 includes signals from an external source such as a microcontroller (not shown). The galvanic isolator 106 processes the digital signal 104 and generates an output signal 108. For example, the galvanic isolator 106 provides signal isolation between the microcontroller and a DAC component 102. In this example, the galvanic isolator 106 receives digital signals from the microcontroller and generates the (digital) output signal 108 to the DAC component 102 for digital-to-analog conversion.

Figure 2:
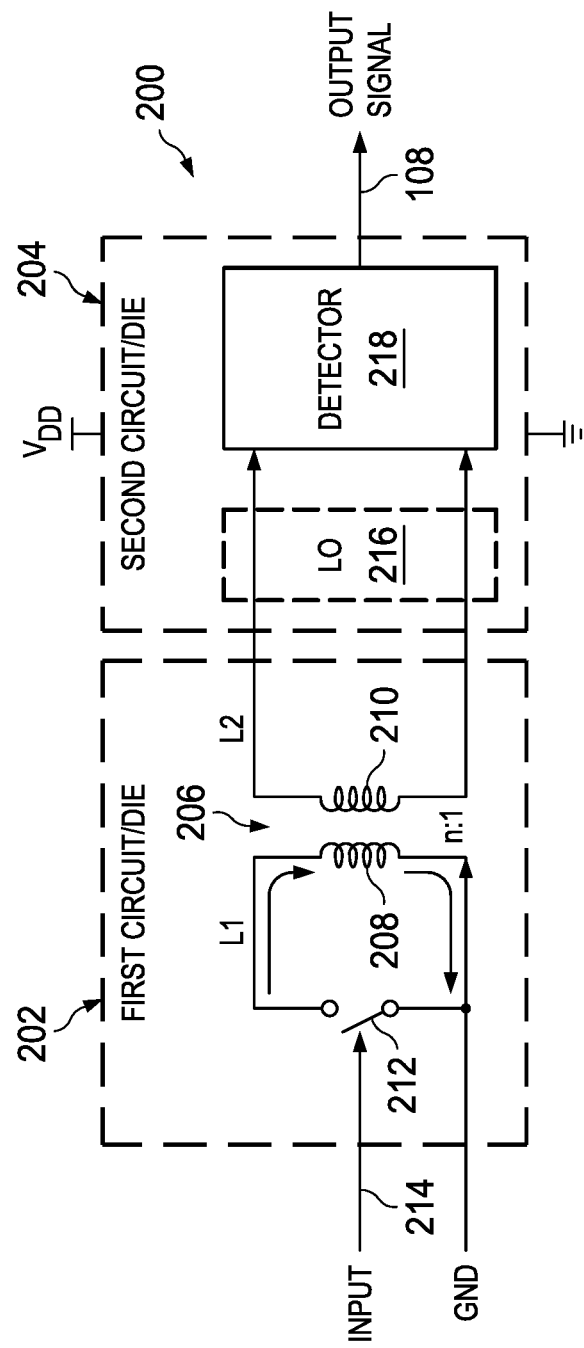
FIG. 2 is an example of a device that implements a signal isolation as described herein.

FIG. 2 illustrates an example implementation of a device 200 that implements signal isolation as described herein. The device 200 is similar to the galvanic isolator 106 that couples the digital input 104 of the microcontroller to the device component 102.

As shown, the device 200 includes a first circuit 202 (or first die) and a second circuit 204 (or a second die). In an embodiment, the first circuit 202 components include a transformer 206 with a primary winding 208 and a secondary winding 210. In this embodiment, the first circuit 202 further includes a switch 212 controlled by an input signal 214. The input signal 214, for example, is equivalent to the digital input signal 104 of FIG. 1.

The second circuit 204 components include a local oscillator (LO) 216 coupled to a detector 218. The LO 216 is formed by adding a capacitor (not shown) in between two terminals of the second winding 210. The second circuit 204 generates the output signal 108, which will be further processed by the DAC 102.

As described herein, the input signal 214 includes digital signals from the microcontroller. For example, the device 200 is utilized in a programmable logic controller (PLC) module. In this example, the PLC module includes the microcontroller that generates control signals such as the digital input signal 214.

In an embodiment, the input signal 214 controls the opening (i.e., open switch) and closing (i.e., short circuit) of the switch 212. For example, a logic 1 and a logic 0 closes and opens the switch 212, respectively. In this example, the detector 218 detects the logic 1s and 0s of the input signal 214 based on detected presence or absence of oscillations at the LO 216. The LO 216, for example, is configured to react on impedance changes of the transformer 206 when the switch 212 is turned ON or turned OFF.

For example, the switch 212 turns ON (i.e., high logic) on a clock signal. In this example, a low impedance is created at the secondary winding 210 and a change in oscillation at the LO 216 occurs. The change includes low or absence of oscillations at the LO 216. The absence or stopping of oscillations corresponds to logic 1 digital input signal 214. In another example, such as on a subsequent clock signal, the switch 212 turns OFF due to a logic 0 digital input signal 214. In this example, a high impedance is created at the secondary winding 210 and a change in the initial low oscillations at the LO 216 occurs. The change includes triggering or generating of high oscillations at the LO 216. In these examples, the detector 218 is configured to detect the logic 1s and 0s based on the absence or presence of oscillations at the LO 216.

In other embodiments, the detector 218 is configured to detect the logic 1s and 0s based on changes in frequency of oscillations and/or amplitude of the oscillations. As depicted, the transformer 206 is a step-down transformer with a winding ratio of n to 1 (n:1). In this manner, the detector 218 is configured to detect the amplitude of the oscillations based on the winding ratio. For example, for a 2:1 winding ratio, a secondary voltage will be half of the primary voltage. In this example, the detector 218 is configured to detect the secondary voltage based on this winding ratio. Thereafter, after logic detection of the digital input signal 214 by the detector 218, the output signal 108 is generated and further processed by the DAC 102.

Figure 3:
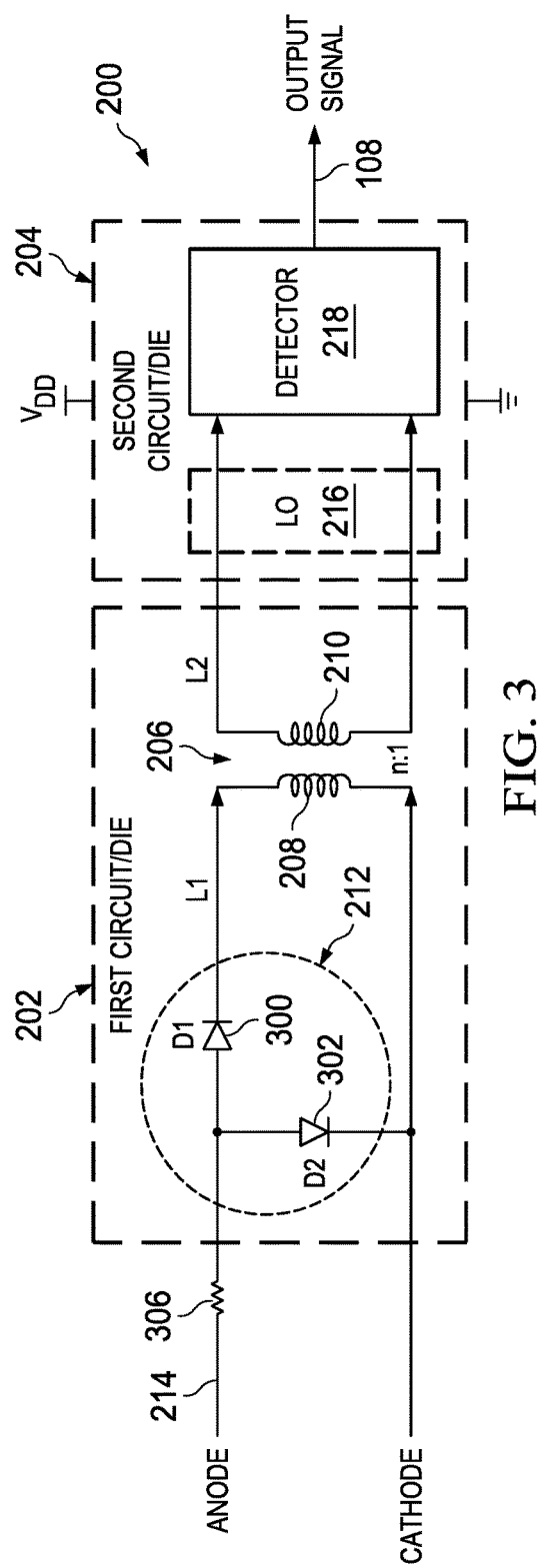
FIG. 3 is an example of a first circuit that receives an input signal as described herein.

FIG. 3 illustrates an example implementation of the first circuit 202 that receives the input signal 214 as described herein. As shown, the first circuit 202 includes a first diode 300, a second diode 302, and an external board resistance that is represented by a resistor 306. The external board resistor 306 may or may not be present and will not affect the embodiments described herein.

The first diode 300 and the second diode 302 are coupled to the primary winding 208 in a way that their anodes are positive during a positive cycle of the input signal 214. In this regard, the first diode 300 and the second diode 302 represent the short circuit switch 212 as described in FIG. 2 above. In other words, diode 300 and diode 302 act as a switch in order for detector 218 to detect the presence or absence of oscillations by the LO 216 of the digital input signal 214.

For example, both anodes of the first diode 300 and the second diode 302 are connected together as shown. A high logic input signal 214 (e.g., logic 1) will provide a shorted first diode 300 and a shorted second diode 302. A low impedance is thereafter created on the primary winding 208 and the secondary winding 210. This low impedance will then create a change in the oscillation of the LO 216. For example, the change includes a low or stopping of oscillations on the LO 216 due to the generated low impedance at the second winding 210.

During a logic 0 of the input signal 214, the first diode 300 and the second diode 302 are open circuit. In this case, there is an increase in oscillations of the LO 216, and the detector 218 at the second circuit 204 detects this logic 0 from the input signal 214.

In an embodiment, the first diode 300, the second diode 302, and/or the resistor 306 are part of a circuit board, and not necessarily part of the first circuit 202. The first circuit 202 and the second circuit 204 is part of an MCM package. In another embodiment, the first circuit 202 is part of the MCM package while the second circuit 204 is realized using discrete components on a circuit board. In another embodiment, the first circuit 202 and the second circuit 204 are formed using discrete components on the circuit board. In these embodiments, possible cost saving on the galvanic isolation is realized as a result.

Figure 4:
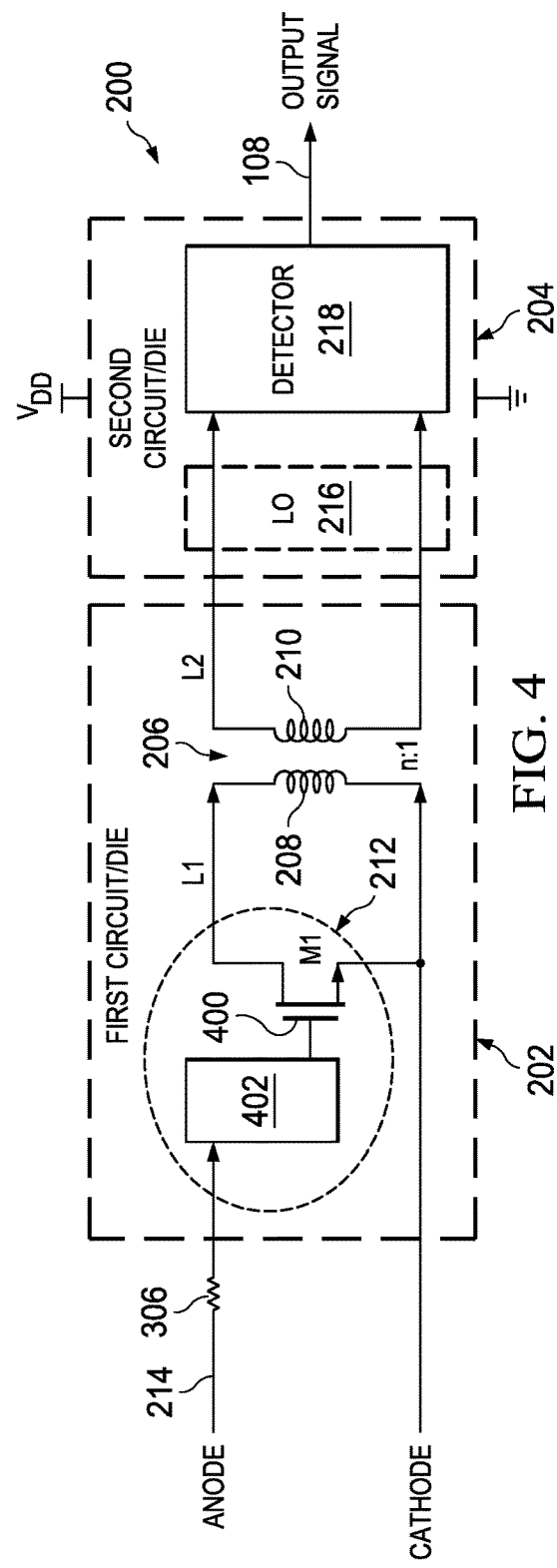
FIG. 4 is an example of a first circuit that receives an input signal as described herein.

FIG. 4 illustrates another example implementation of the first circuit 202 that receives the input signal 214 as described herein. Instead of forming and using the first diode 300 and the second diode 302 in FIG. 3 above, the first circuit 202 includes a transistor 400 with a base controller 402 directly controlled by the input signal 214. That is, the transistor 400 with the base controller 402 represents the switch 212 described in FIG. 2 above, and the detector 218 will detect the presence or absence of oscillations at the LO 216. The presence (high oscillations) or absence (low) oscillations denote logic low and logic high input signals 214, respectively.

For example, during the logic high (e.g., positive signal cycle) of the input signal 214, the transistor 400 is turned ON and a low impedance is created on the primary winding 208 and the secondary winding 210. This low impedance stops oscillations on the LO 216. For example, the low or stopping of oscillations on the LO 216 is due to the generated low impedance at the secondary winding 210.

During the logic low (e.g., negative cycle) input signal 214, the transistor 400 is turned OFF and a high impedance is seen at the primary winding 208 and the secondary winding 210. Based on the presence of absence of oscillations on the LO 216, the detector 218 at the second circuit 204 detects the information from the input signal 214.

In other embodiments, the detector 218 is configured to compare absence or presence of oscillations based on the oscillation amplitude and/or frequencies. For example, for a resonant LO 216, the amplitude is high compared to non-resonant LO 216. In another example, the frequency of the resonant LO 216 is determined and distinguished from the frequency of non-resonant LO 216. In these examples, the detector 218 compares the amplitude and/or frequency of resonant and non-resonant LO 216. Furthermore, the detector 218 detects and compares the amplitude based on the winding ratio (n:1) of the transformer 206. For example, for a 2:1 winding ratio, the amplitude of the secondary voltage is half of the primary voltage at resonant frequency.

Figure 5:
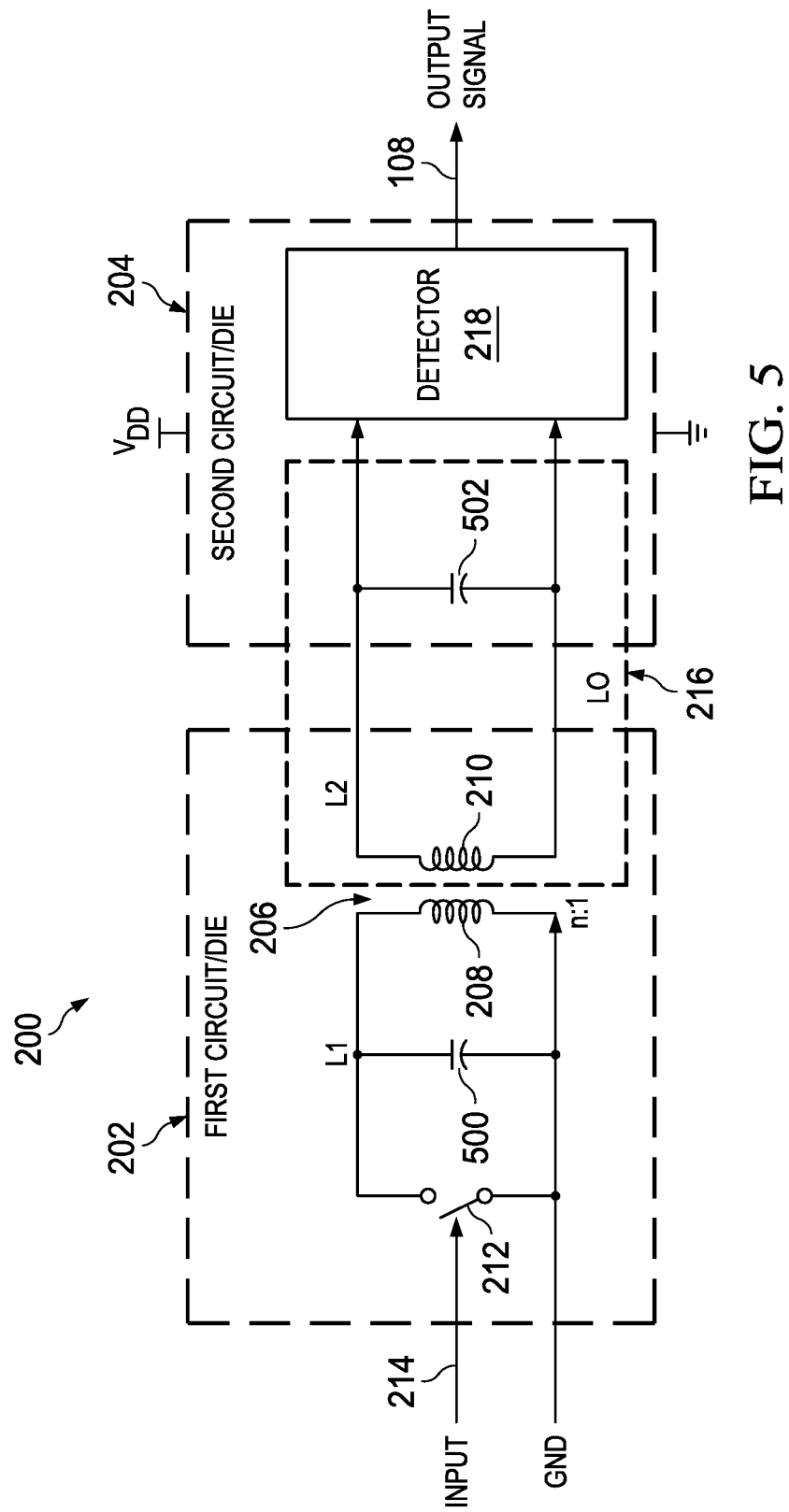
FIG. 5 is an example local oscillator formed on a device as described herein.

FIG. 5 illustrates an example implementation of the LO 216 on the device 200 as described herein. In an embodiment, a first capacitor 500 and a second capacitor 502 are connected in parallel with the primary winding 208 and the secondary winding 210, respectively. In this embodiment, the first capacitor 500 and the second capacitor 502 are formed on the first circuit 202 and the second circuit 204, respectively.

As depicted, the LO 216 is formed by a combination of the secondary winding 210 and the second capacitor 502 (as tuning capacitor). That is, the LO 216 is an inductor-capacitor (LC) circuit that is formed by the secondary winding 210 and the second capacitor 502. Depending upon inductance and capacitance values of the secondary winding 210 and the second capacitor 502, respectively, the LO 216 will oscillate at a certain resonant frequency. For example, when inductive reactance ($X_L$) of the secondary winding 210 is equal to capacitive reactance ($X_C$) of the second capacitor 502, then a resonant frequency and high impedance are present in the second circuit 204. In this example, the detector 218 uses this as a reference in detecting presence or absence of oscillations in the LO 216.

For example, during the logic high-input signal 214, the switch 212 is turned ON and a low impedance is created on the primary winding 208 and the secondary winding 210. This low impedance will stop the resonant oscillations of the LO 216. In this example, the low oscillations on the LO 216 are due to the generated low impedance at the secondary winding 210.

During the logic low-input signal 214, the switch 212 is turned OFF and there is a high impedance in the primary winding 208 and the secondary winding 210. In this case, the oscillation of the LO 216 resumes its resonant frequency oscillations, and the detector 218 will take note of this state. Based on the presence or absence of the oscillations on the LO 216, the detector 218 at the second circuit 204 detects the digital input from the input signal 214.

In an embodiment, the first capacitor 500 is utilized to tune amplitude and frequency at the primary winding 208 side. The amplitude and frequency are based upon the inductance and capacitance values of the primary winding 208 and the first capacitor 500, respectively.

Figure 6:
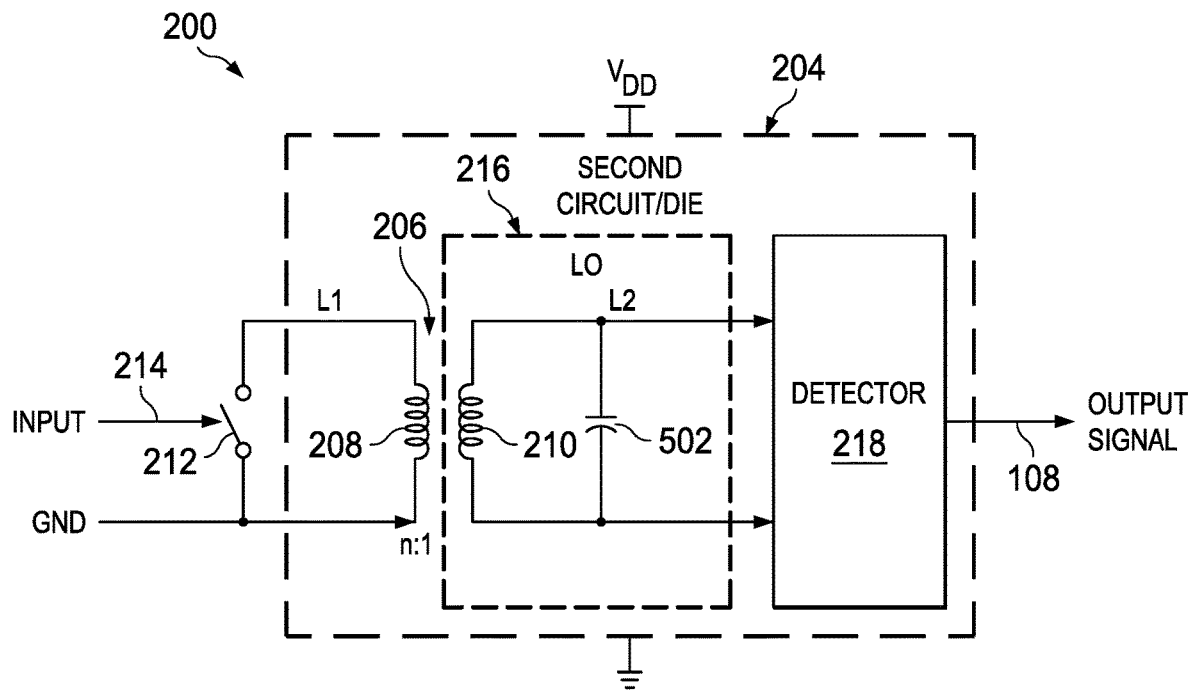
FIG. 6 is an example of a device that implements a signal isolation as described herein.

FIG. 6 illustrates another example implementation of the device 200 that implements a signal isolation as described herein. For example, the signal isolation includes monolithic isolation of the device 200.

In an embodiment, the second circuit 204 includes the transformer 206, the LO 216, and the detector 218. In this embodiment, the switch 212 is disposed on a separate circuit board independent of the second circuit 204. In this embodiment, the first circuit 202 is removed to provide ultra-low cost galvanic isolation as described herein.

As depicted, the LO 216 is formed by a combination of the secondary winding 210 and the second capacitor 502. Depending upon inductance and capacitance values of the secondary winding 210 and the second capacitor 502, respectively, the LO 216 will oscillate at a certain resonant frequency. This oscillation at the certain resonant frequency will be changed in case of sudden change in the impedance at the secondary winding 210.

During the logic 1 input signal 214, the switch 212 is turned ON and a low impedance is created on the primary winding 208 and the secondary winding 210. This low impedance stops the resonant oscillations of the LO 216. For example, the resonant oscillations are due to the generated low impedance at the secondary winding 210.

During the logic 0 input signal 214, the switch 212 is turned OFF and there is a high impedance generated in the primary winding 208 and the secondary winding 210. In this case, there will be resonant oscillations on the LO 216, and the detector 218 will take note of this state. Based on the presence or absence of resonant oscillations on the LO 216, the detector 218 at the second circuit 204 detects the information from the input signal 214.

Figure 7:
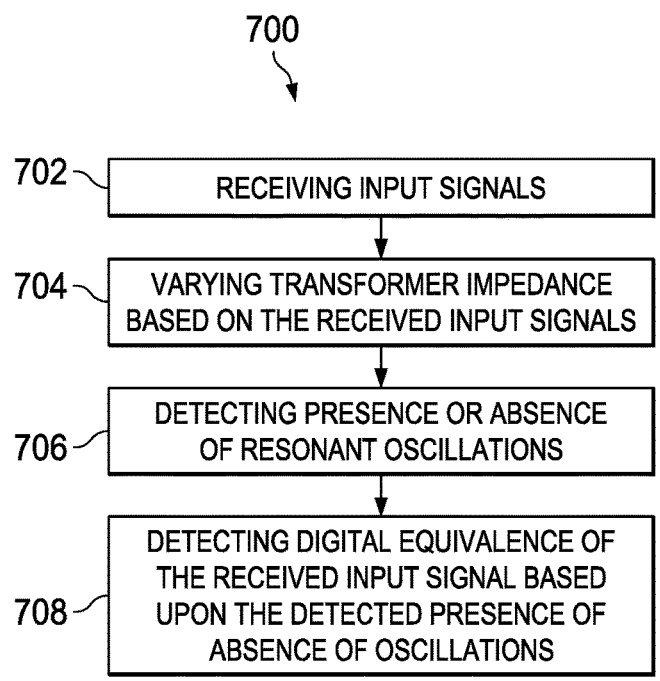
FIG. 7 is an example process chart illustrating an example method for implementing galvanic isolation as described herein.

FIG. 7 shows an example process chart 700 illustrating an example method for implementing ultra-low cost galvanic isolation as described herein. The order in which the method is described is not intended to be construed as a limitation, and any number of the described method blocks is combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 702, receiving an input signal is performed. For example, the first circuit 202 and particularly, the first winding 208 receives the digital input signal 214.

At block 704, varying an impedance of a winding of a transformer based upon the received input signal is performed. For example, the first circuit 202 includes the switch 212 that is coupled to the primary winding 208 of the transformer 206. The switch 212 is configured to turn ON and OFF depending upon the logic state (e.g., logic 1 or 0) of the input signal 214. The turning ON and OFF of the switch 212 creates variation in the impedance of the primary winding 208 and the secondary winding 210. In an embodiment, the switch 212 includes the first diode 300 and the second diode 302.

At block 706, detecting presence or absence of oscillations based upon the variation of impedance at the winding of the transformer. For example, the LO 216 is formed by connecting the second capacitor 502 in parallel with the secondary winding 210. In this example, the detector 218 is configured to detect presence or absence of resonant oscillations at the LO 216.

In another embodiment, the detector 218 is configured to compare absence or presence of oscillations based on the oscillation amplitude and/or frequencies. For example, for a resonant LO 216, the amplitude is high compared to non-resonant LO 216. In another example, the frequency of the resonant LO 216 is determined and distinguished from the frequency of non-resonant LO 216. In these examples, the detector 218 compares the amplitude and/or frequency of resonant and non-resonant LO 216.

At block 708, detecting digital equivalence of the received input signal based upon the detected presence of absence of oscillations. For example, the detector 218 may determine the digital equivalent of the input signal 214 based upon the presence or absence of resonant oscillations at the formed LO 216.

What is claimed is:

1. A device comprising:
   a transformer that includes a primary winding and a secondary winding, wherein the primary winding receives a digital input signal;
   an oscillator formed on the secondary winding with a capacitor in parallel with the secondary winding, wherein the oscillator varies its oscillations in response to variations of the digital input signal;
   a detector coupled to the oscillator, wherein the detector detects changes in the oscillations in response to the variations resulting from the digital input signal, wherein the detector generates a digital output based on the detected changes in oscillations.

2. The device of claim 1 further comprising: a switch coupled to the primary winding, wherein the switch provides a short circuit to the primary winding during a logic high of the received digital input signal.

3. The device of claim 2, wherein the short circuit generates a low impedance variation at the secondary winding resulting in lower oscillation of the oscillator.

4. The device of claim 2, wherein the switch and the transformer are part of a first circuit while the oscillator and the detector are part of a second circuit.

5. The device of claim 1, wherein the detector generates the digital output based upon presence or absence of resonant oscillations at the oscillator.

6. The device of claim 5, wherein the presence or absence of resonant oscillations is based upon detected amplitude and frequency of oscillations of the oscillator.

7. The device of claim 1, wherein the oscillator is formed by connecting a capacitor in parallel across the secondary winding.

8. The device of claim 7, wherein the capacitor provides tuning of the oscillator.

9. The device of claim 1 further comprising a pair of diodes that receive the digital input signals, wherein anodes of the pair of diodes are connected together to act as a switch for the primary winding.

10. The device of claim 1 further comprising a transistor coupled to the primary winding, wherein the transistor acts as a switch controlled by the received digital input signal.

11. A device comprising:
    a transformer that includes a primary winding and a secondary winding, wherein the primary winding receives a digital input signal;
    a switch coupled to the primary winding, wherein the switch is controlled by the digital input signal;
    an oscillator formed on the secondary winding with a capacitor in parallel with the secondary winding, wherein the oscillator varies its oscillations in response to variations of the digital input signal;

a detector coupled to the oscillator, wherein the detector detects changes in oscillations in response to the variations resulting from the digital input signal, and generates a digital output based on the detected oscillations.

12. The device of claim 11, wherein the switch provides a short circuit to the primary winding during a logic high of the input signal.

13. The device of claim 12, wherein the short circuit generates a low impedance variation at the secondary winding, the low impedance resulting in lower oscillations of the formed oscillator.

14. The device of claim 11, wherein the switch and the transformer are part of a first circuit while the oscillator and the detector are part of a second circuit.

15. The device of claim 11, wherein the detector generates the digital output based upon a presence or absence of resonant oscillations on the formed oscillator.

16. A device comprising:
a switch;
a circuit coupled to the switch, wherein the circuit comprises:
a transformer that includes a primary winding and a secondary winding, wherein the primary winding receives a digital input signal from the switch;
an oscillator that is part of the secondary winding with a capacitor in parallel with the secondary winding, wherein the oscillator varies its oscillations in response to variations of the received digital input signal; and
a detector coupled to the oscillator, wherein the detector detects changes in the oscillations in response to the variations of the received digital input signal, wherein the detector generates a digital output based on the detected changes in oscillations.

17. The device of claim 16, wherein the switch provides a short circuit to the primary winding during a logic high of the received digital input signal.

18. The device of claim 17, wherein the short circuit generates a low impedance variation at the secondary winding, the low impedance resulting in lower oscillations of the oscillator.

19. The device of claim 16, wherein the switch and the transformer are part of a first circuit while the oscillator and the detector are part of a second circuit.

* * * * *